United States Patent
Chan et al.

(10) Patent No.: US 6,869,884 B2
(45) Date of Patent: Mar. 22, 2005

(54) PROCESS TO REDUCE SUBSTRATE EFFECTS BY FORMING CHANNELS UNDER INDUCTOR DEVICES AND AROUND ANALOG BLOCKS

(75) Inventors: Lap Chan, Singapore (SG); Sanford Chu, Singapore (SG); Chit Hwei Ng, Singapore (SG); Purakh Verma, Singapore (SG); Jia Zhen Zheng, Singapore (SG); Johnny Chew, Singapore (SG); Choon Beng Sia, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 191 days.

(21) Appl. No.: 10/225,828

(22) Filed: Aug. 22, 2002

(65) Prior Publication Data
US 2004/0038542 A1 Feb. 26, 2004

(51) Int. Cl.[7] .............................................. H01L 21/302
(52) U.S. Cl. ...................... 438/705; 438/712; 438/719; 438/723; 438/724; 438/756; 438/757
(58) Field of Search ............................... 438/705, 712, 438/719, 723, 724, 756, 757

(56) References Cited

U.S. PATENT DOCUMENTS

| | | | | |
|---|---|---|---|---|
| 5,539,241 A | | 7/1996 | Abidi et al. ................. 257/531 |
| 5,600,174 A | | 2/1997 | Reay et al. .................. 257/467 |
| 5,972,776 A | * | 10/1999 | Bryant ........................ 438/440 |
| 5,976,945 A | * | 11/1999 | Chi et al. .................... 438/386 |
| 6,057,202 A | | 5/2000 | Chen et al. .................. 438/381 |
| 6,180,995 B1 | | 1/2001 | Hebert ........................ 257/531 |
| 6,218,319 B1 | * | 4/2001 | Dutron et al. .............. 438/784 |
| 6,275,122 B1 | * | 8/2001 | Speidell et al. ............. 333/186 |
| 6,287,931 B1 | | 9/2001 | Chen ........................... 438/381 |
| 6,313,008 B1 | | 11/2001 | Leung et al. ................ 438/424 |
| 6,326,314 B1 | * | 12/2001 | Merrill et al. .............. 438/750 |
| 6,441,435 B1 | * | 8/2002 | Chan ........................... 257/347 |
| 6,465,852 B1 | * | 10/2002 | Ju ................................ 257/396 |
| 6,627,505 B2 | * | 9/2003 | Adan ........................... 438/311 |

* cited by examiner

Primary Examiner—Nadine G. Norton
Assistant Examiner—Binh X. Tran
(74) Attorney, Agent, or Firm—George O. Saile; Rosemary L.S. Pike; Stephen G. Stanton

(57) ABSTRACT

A first method of reducing semiconductor device substrate effects comprising the following steps. $O^+$ or $O_2^+$ are selectively implanted into a silicon substrate to form a silicon-damaged silicon oxide region. One or more devices are formed over the silicon substrate proximate the silicon-damaged silicon oxide region within at least one upper dielectric layer. A passivation layer is formed over the at least one upper dielectric layer. The passivation layer and the at least one upper dielectric layer are patterned to form a trench exposing a portion of the silicon substrate over the silicon-damaged silicon oxide region. The silicon-damaged silicon oxide region is selectively etched to form a channel continuous and contiguous with the trench whereby the channel reduces the substrate effects of the one or more semiconductor devices. A second method of reducing substrate effects under analog devices includes forming an analog device on a SOI substrate and then selectively etching the silicon oxide layer of the SOI substrate to form a channel at least partially underlying the analog device.

90 Claims, 3 Drawing Sheets

PROCESS TO REDUCE SUBSTRATE EFFECTS BY FORMING CHANNELS UNDER INDUCTOR DEVICES AND AROUND ANALOG BLOCKS

FIELD OF THE INVENTION

The present invention relates generally to fabrication of semiconductor devices, and more specifically to methods of reducing substrate effects under inductor devices and around analog blocks.

BACKGROUND OF THE INVENTION

Inductor quality (Q) is very often reduced by substrate eddy current, i.e. image current. Similarly, analog devices are very sensitive to noise generated by the underlying silicon substrate, i.e. substrate effects.

U.S. Pat. No. 6,180,995 B1 to Hebert describes a process to etch a trench in a substrate under an inductor.

U.S. Pat. No. 6,313,008 B1 to Leung et al. describes a trench formed by an implant and isotropic etch process.

U.S. Pat. No. 6,326,314 B1 to Merrill et al. describes an inductor process with a trench in a substrate.

U.S. Pat. No. 6,287,931 B1 to Chen describes an inductor process with a trench in an insulating layer.

U.S. Pat. No. 6,057,202 to Chen et al. describes a trench under inductors.

U.S. Pat. No. 5,539,241 to Abidi et al. and U.S. Pat. No. 5,600,174 to Reay et al. each describe inductor processes with trenches underlying the structure.

SUMMARY OF THE INVENTION

Accordingly, it is an object of the present invention to provide improved methods of reducing substrate effects under inductor devices and around analog blocks.

Other objects will appear hereinafter.

It has now been discovered that the above and other objects of the present invention may be accomplished in the following manner. Specifically, in a first method of reducing semiconductor device substrate effects, $O^+$ or $O_2^+$ are selectively implanted into a silicon substrate to form a silicon-damaged silicon oxide region. One or more devices are formed over the silicon substrate proximate the silicon-damaged silicon oxide region within at least one dielectric layer. A passivation layer is formed over the at least one upper dielectric layer. The passivation layer and the at least one upper dielectric layer are patterned to form a trench exposing a portion of the silicon substrate over the silicon-damaged silicon oxide region. The silicon-damaged silicon oxide region is selectively etched to form a channel continuous and contiguous with the trench whereby the channel reduces the substrate effects of the one or more semiconductor devices. A second method of reducing substrate effects under analog devices includes forming an analog device on a SOI substrate and then selectively etching the silicon oxide layer of the SOI substrate to form a channel at least partially underlying the analog device.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

First Preferred Embodiment—FIGS. 1 to 5
Initial Structure

Figure 1:
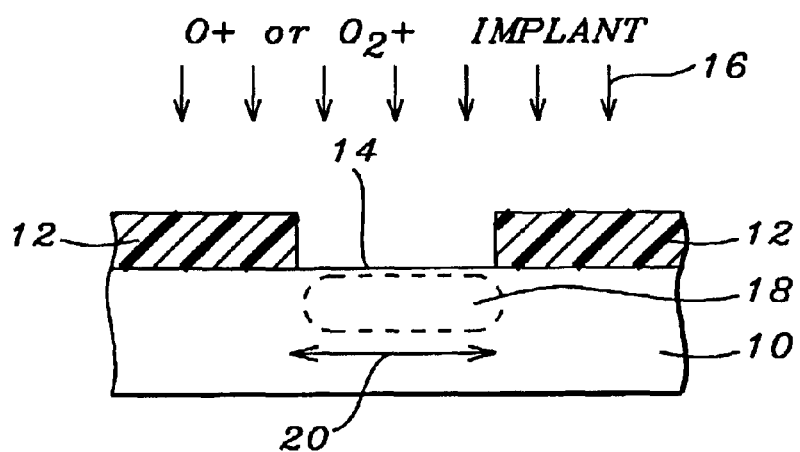
FIGS. 1 to 5 schematically illustrate in cross-sectional representation a first preferred embodiment of the present invention.

FIG. 1 illustrates a cross-sectional view of a silicon substrate 10 that is preferably a semiconductor substrate.

A first patterned masking layer 12 is formed over silicon substrate 10 leaving a portion 14 of silicon substrate 10 exposed. First masking layer 12 is preferably comprised of photoresist.

Using the first patterned masking layer 12 as a mask, an oxygen implant 16 is implanted into silicon substrate 10 to a depth of preferably from about 1000 to 20,000 Å and more preferably from about 5000 to 10,000 Å to form a silicon-damaged silicon oxide ($SiO_2$) portion 18 within silicon substrate 10. The oxygen implant 16 is either an $O^+$ or an $O_2^+$ implant and is conducted at a dose of preferably from about 1E16 to 1E17 ions/cm$^2$ and more preferably from about 4E16 to 8E16 ions/cm$^2$.

Silicon-damaged portion 18 has a maximum width 20 of preferably from about 8 to 52 $\mu$m and more preferably about 10 to 50 $\mu$m.

Formation of ILD Layer 24

Figure 2:
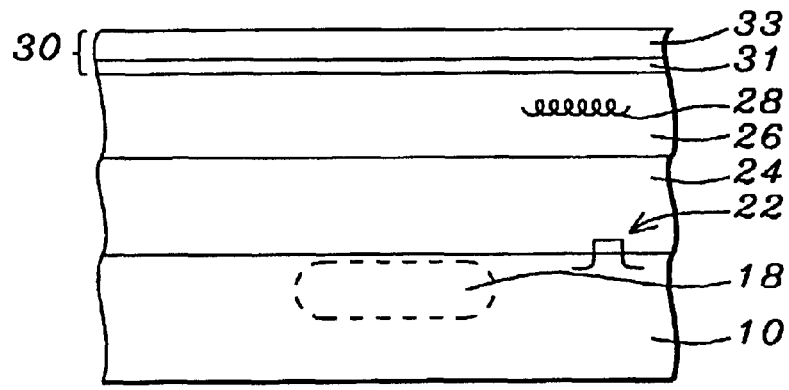

As shown in FIG. 2, first patterned masking layer 12 is removed, the structure is cleaned as necessary and a metal-oxide semiconductor (MOS) device 22 may be formed upon silicon substrate 10 adjacent silicon-damaged silicon oxide portion 18.

An interlayer dielectric (ILD) layer 24 is formed over silicon substrate 10 and over any semiconductor devices 22 formed upon silicon substrate 10 to a thickness of preferably from about 4000 to 12,000 Å and more preferably from about 6000 to 10,000 Å. ILD layer 24 is preferably formed of thick field oxide, boron phosphorus silicon glass (BPSG), PECVD TEOS oxide, APCVD $O_3$/TEOS oxide or HDP oxide and is more preferably BPSG doped oxide.

ILD layer 24 may also include interconnect structures and other semiconductor devices (not shown).

Formation of Inductor 28 Within Dielectric Layer 26

As shown in FIG. 2, a second IMD dielectric layer 26 is formed over the ILD layer 24 and an inductor 28 may be formed with the second/upper dielectric layer 26 adjacent the silicon-damaged silicon oxide portion 18 in conjunction with, or in place of, the semiconductor device 22.

IMD dielectric layer 26 is preferably comprised of an HDP oxide/TEOS oxide sandwich, PECVD $SiH_4$ oxide, PECVD TEOS oxide or HDP oxide (for gap fill) and is more preferably an HDP oxide/TEOS oxide sandwich. Dielectric layer 26 has a thickness of preferably from about 4000 to 12,000 Å and more preferably from about 6000 to 10,000 Å.

Formation of Passivation Layer 30

Passivation layer 30 is then formed over IMD dielectric layer 26. Passivation layer 30 preferably comprises a lower 2% PSG layer 31 having a thickness of preferably from about 2000 to 4000 Å and more preferably from about 2500 to 3500 Å and an upper, overlying nitride or silicon nitride layer 33 having a thickness of preferably from about 3000 to 8000 and more preferably from about 4000 to 6000 Å.

Etching of Trench 34

Figure 3:
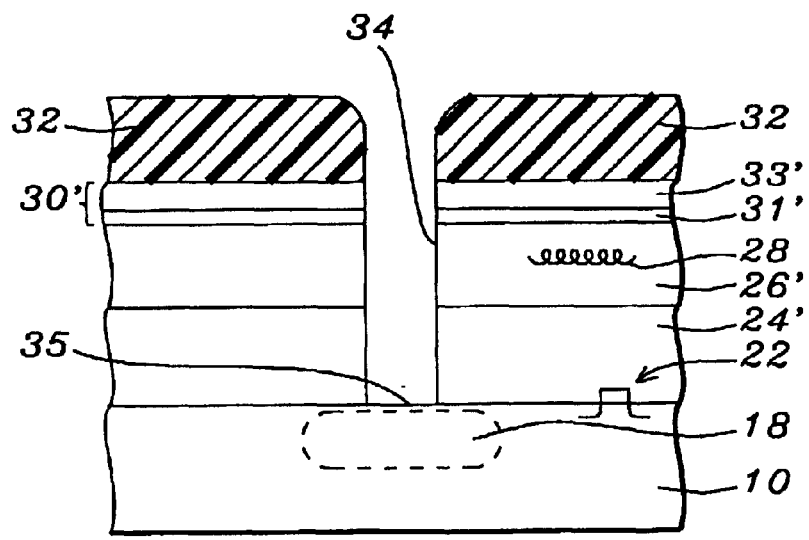

As shown in FIG. 3, a second patterned masking layer 32 is formed over passivation layer 30 and, using the second patterned masking layer as a mask, passivation layer 30, IMD dielectric layer 26 and ILD layer 24 are etched over silicon-damaged silicon oxide portion 18 forming trench 34 and exposing a portion 35 of silicon substrate 10 roughly centered over silicon-damaged silicon oxide portion 18.

Trench 34 is preferably formed using a reactive ion etch (RIE), an high density plasma (HDP) oxide etch or an inductive couple plasma (ICP) etch and more preferably an RIE oxide etch to save cost.

Formation of Channel 36

Figure 4:
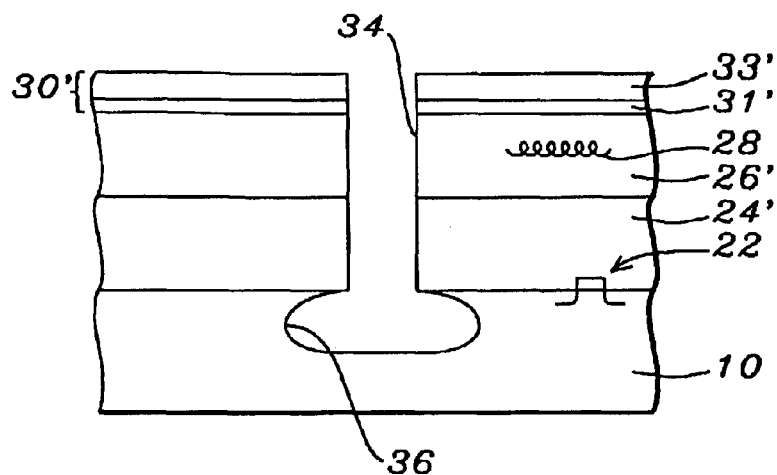

As shown in FIG. 4, an isotropic etch is used to etch out the silicon-damaged silicon oxide portion 18 to form trench/channel 36. Preferably from about 10 to 50 µm of silicon substrate 10 adjacent silicon-damage silicon oxide portion 18 is also removed to create a wider channel 36. Channel 36 has a maximum width 37 of from about 50 to 500 µm.

The formation of trench 34 and channel 36 reduces the substrate noise effect on the MOS device 22 and, if formed, also reduces the substrate effect on the inductor 28 quality factor (Q). With the formation of inductor 28/dielectric layer 26, a system-on-chip on non-silicon-on-insulator (SOI) substrate is formed.

Formation of Uppermost Sealing Layer 38

Figure 5:
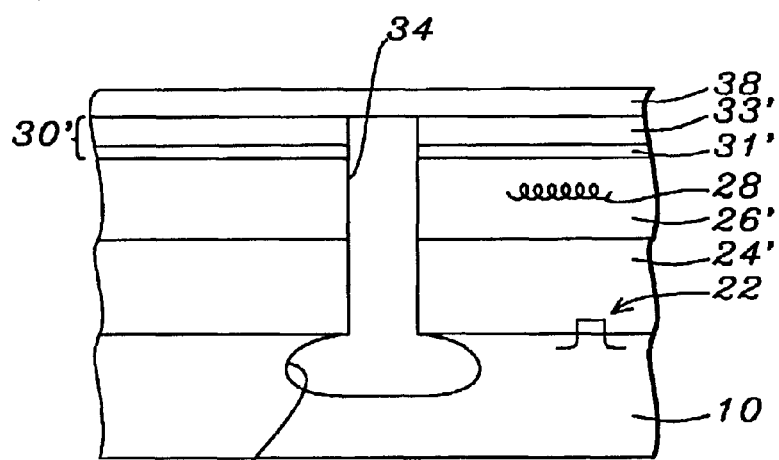

As shown in FIG. 5, an optional uppermost sealing layer 38 may then be formed over patterned passivation layer 30', sealing or closing off trench 34. Uppermost sealing layer 38 is preferably formed to a thickness of from about 3000 to 7000 Å and more preferably from about 3000 to 6000 Å. Sealing layer 38 is preferably comprised of PECVD nitride or PECVD silicon nitride (to minimize wafer scratching). It is noted that optional uppermost sealing layer 38 may not be necessary.

Second Embodiment—FIGS. 6 to 9

Initial Structure

Figure 6:
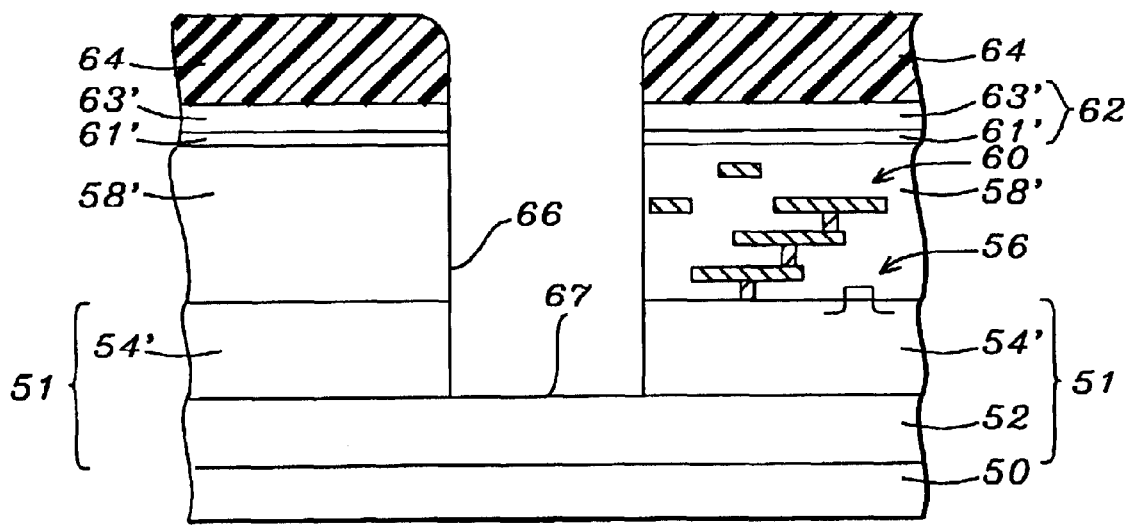
FIGS. 6 to 8 schematically illustrate in cross-sectional representation a second preferred embodiment of the present invention.

FIG. 6 illustrates a cross-sectional view of a silicon-on-insulator (SOI) substrate 51 over silicon substrate 50 that is preferably a semiconductor substrate. A silicon oxide ($SiO_2$) layer 52 is formed over silicon substrate 50 to a thickness of preferably from about 500 to 2000 Å and more preferably from about 500 to 1500 Å. A second silicon layer 54 is then formed over $SiO_2$ layer 52 to a thickness of preferably from about 500 to 2000 Å and more preferably from about 500 to 1500 Å.

A MOS device 56 may be formed upon SOI substrate 54 and an analog device represented as at 60 is formed within ILD layer 58. ILD layer 58 may be comprised of multiple layers and is preferably comprised of PECVD TEOS oxide, PECVD $SiH_4$ oxide, HDP oxide or a low-k dielectric material and is more preferably comprised of a low-k dielectric material.

A passivation layer 62 is formed over ILD layer 58. Passivation layer 62 preferably comprises a lower 2% PSG layer 61 having a thickness of preferably from about 2000 to 4000 Å and more preferably from about 2500 to 3500 Å and an upper, overlying nitride or silicon nitride layer 63 having a thickness of preferably from about 3000 to 8000 and more preferably from about 4000 to 6000 Å.

Formation of Trench 66

A first patterned masking layer 64 is formed over passivation layer 62 and is preferably comprised of photoresist having a thickness of preferably from about 8000 to 22,000 Å and more preferably from about 12,000 to 18,000.

As shown in FIG. 6, using first patterned masking layer 64 as a mask, passivation layer 62, ILD layer 58 and silicon layer/SOI substrate 54 are patterned to form trench 66 exposing a portion 67 of $SiO_2$ layer 52 adjacent analog device 60 and MOS 56.

Formation of Channel 70

Figure 7:
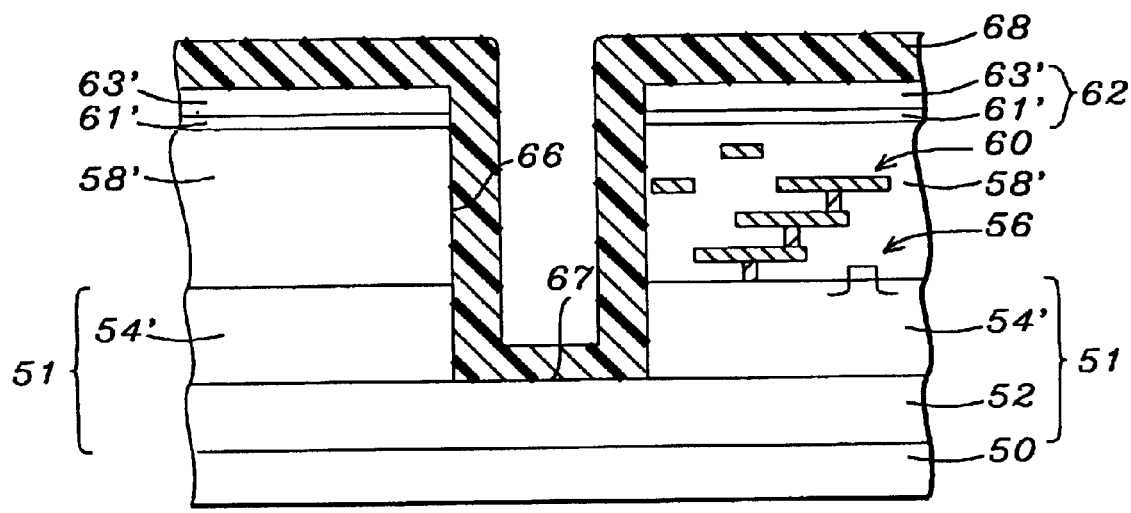

As shown in FIG. 7, first patterned masking/photoresist layer 64 is removed, preferably by a plasma $O_2$ resist strip (PRS) followed by a chemical resist strip (CRS) using a sulfuric peroxide mixture.

Then, as shown in FIG. 7, a second patterned masking layer 68 is deposited over patterned passivation layer 62', over the side walls of trench 66 and partially over the exposed portion 67 of $SiO_2$ layer 52. Second patterned masking layer 68 is preferably comprised of nitride or silicon nitride and has a thickness of preferably from about 1500 to 2000 Å and more preferably from about 1750 to 2250 Å.

Formation of Sidewall Spacers 71

Figure 8:
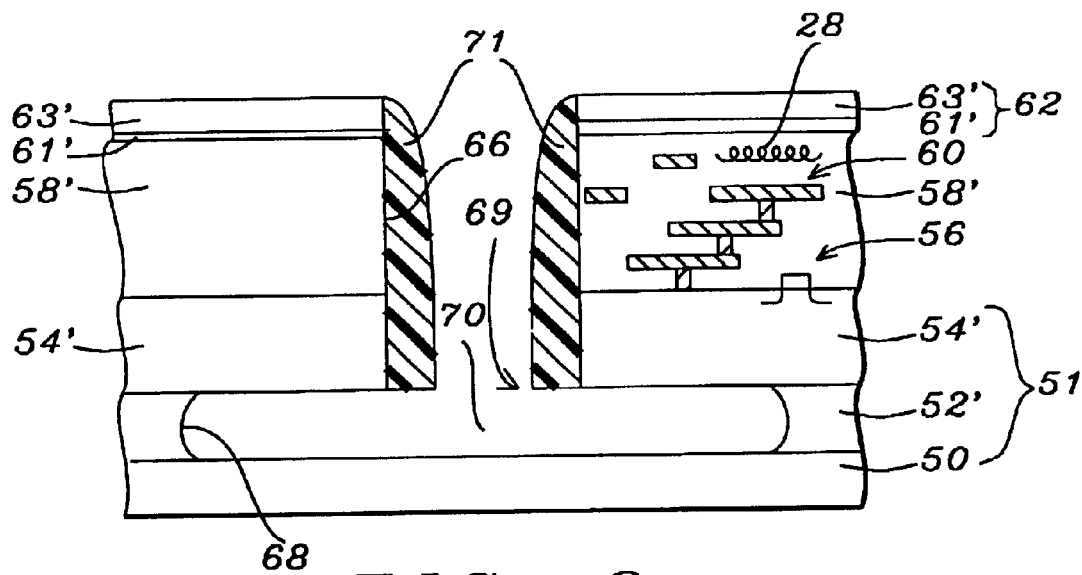

As shown in FIG. 8, second patterned masking nitride/silicon nitride layer 68 is etched to form sidewall spacers 71 over the side walls of trench 66, to protect the side walls of trench 66.

A wet etch process is then used to etch channel 70 within $SiO_2$ layer 52 through second patterned masking layer opening 69/sidewall spacers 71. The wet etch process preferably employs a 10:1 dilute HF solution.

Channel 70 extends under at least a portion of analog device 60 and under MOS device 56. Channel 70 has a width of preferably from about 50 to 250 µm and more preferably from about 100 to 200 µm.

The formation of channel 70 reduces the substrate noise effect on the analog device 60 and MOS device 56.

Figure 9:
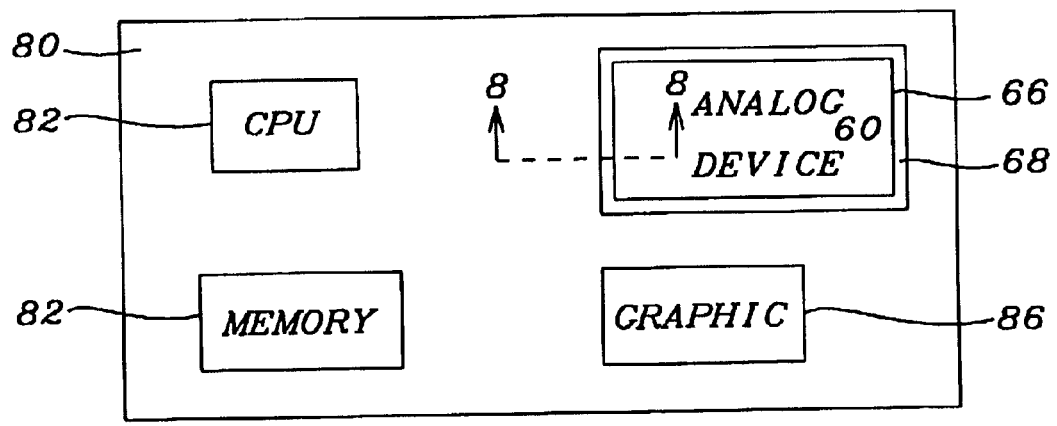
FIG. 9 schematically illustrates a plan view incorporating the structure of FIG. 8 along line 8—8.

FIG. 9 is an overhead plan view of a system-on-chip 80 incorporating analog device 60 with trench 66 and channel 70 formed around its periphery. FIG. 8 is a cross-sectional view of FIG. 9 alone line 8—8. System-on-chip 80 also includes a central processing unit (CPU) 82, memory 84 and graphic device 86.

Advantages of the Invention

The advantages of one or more embodiments of the present invention include:

1) reduction of substrate effects, i.e. noise reduction, for the inductor devices;
2) increased inductor quality (Q factor) by reduction of the substrate eddy current; and
3) to provide the environment for multi-functional chips on the same substrate, i.e., e.g., system-on-chip.

While particular embodiments of the present invention have been illustrated and described, it is not intended to limit the invention, except as defined by the following claims.

We claim:

1. A method of reducing semiconductor device substrate effects, comprising the steps of:
   providing a silicon substrate;
   selectively implanting $O^+$ or $O_2^+$ into the silicon substrate to form a silicon-damaged silicon oxide region;
   forming one or more semiconductor devices over the silicon substrate proximate the silicon-damaged silicon oxide region within at least one upper dielectric layer;
   forming a passivation layer over the at least one upper dielectric layer;
   patterning the passivation layer and the at least one upper dielectric layer, to form a trench exposing a portion of the silicon substrate over the silicon-damaged silicon oxide region; and
   selectively etching the silicon-damaged silicon oxide region to form a channel continuous and contiguous with the trench, whereby the channel reduces the substrate effects of the one or more semiconductor devices.

2. The method of claim 1, including the step of forming an uppermost sealing layer over the patterned passivation layer.

3. The method of claim 1, including the step of forming an uppermost sealing layer over the patterned passivation layer; the uppermost sealing layer is comprised of a material selected from the group consisting of PECVD nitride and PECVD silicon nitride.

4. The method of claim 1, including the step of forming an uppermost sealing layer over the patterned passivation layer, sealing the trench from the ambient atmosphere; the uppermost sealing layer is comprised of PECVD silicon nitride.

5. The method of claim 1, wherein a first patterned masking layer is formed over the silicon substrate to define the location of the $O^+$ or $O_2^+$ implantation into the silicon substrate.

6. The method of claim 1, wherein a first patterned photoresist layer is formed over the silicon substrate to define the location of the $O^+$ or $O_2^+$ implantation into the silicon substrate.

7. The method of claim 1, wherein the $O^+$ or $O_2^+$ is implanted into the silicon substrate to a depth of from about 1000 to 20,000 Å.

8. The method of claim 1, wherein the $O^+$ or $O_2^+$ is implanted into the silicon substrate 10 to a depth of from about 5000 to 10,000 Å.

9. The method of claim 1, wherein the $O^+$ or $O_2^+$ is implanted into the silicon substrate to a dose of from about 1E16 to 1E17 ions/cm$^2$.

10. The method of claim 1, wherein the $O^+$ or $O_2^+$ is implanted into the silicon substrate to a dose of from about 4E16 to 8E16 ions/cm$^2$.

11. The method of claim 1, wherein the silicon-damaged silicon oxide region has a width of from about 8 to 52 μm.

12. The method of claim 1, wherein the silicon-damaged silicon oxide region has a width of from about 10 to 50 μm.

13. The method of claim 1, wherein the at least one upper dielectric layer is comprised of a material selected from the group consisting of boron phosphorus silicon glass (BPSG), PECVD TEOS oxide, APCVD $O_3$/TEOS oxide and HDP oxide.

14. The method of claim 1, wherein the at least one upper dielectric layer is comprised of BPSG doped oxide.

15. The method of claim 1, wherein the at least one upper dielectric layer comprises:
a lower dielectric layer comprised of a material selected from the group consisting of boron phosphorus silicon glass (BPSG), PECVD TEOS oxide, APCVD $O_3$/TEOS oxide and HDP oxide; and
an upper dielectric layer comprised of a material selected from the group consisting of an HDP oxide/TEOS oxide sandwich, PECVD $SiH_4$ oxide, PECVD TEOS oxide and HDP oxide.

16. The method of claim 1, wherein the at least one upper dielectric layer comprises:
a lower dielectric layer comprised of BPSG doped oxide; and
an upper dielectric layer comprised of an HDP oxide/TEOS oxide sandwich.

17. The method of claim 1, wherein the one or more semiconductor devices is one or more MOS devices.

18. The method of claim 1, wherein the one or more semiconductor devices is one or more inductors.

19. The method of claim 1, wherein the one or more semiconductor devices is one or more MOS devices and one or more inductors.

20. The method of claim 1, wherein the passivation layer is comprised of a lower layer and an upper layer.

21. The method of claim 1, wherein the passivation layer is comprised of a lower PSG layer and an upper nitride or silicon nitride layer.

22. The method of claim 1, wherein the passivation layer is comprised of:
a lower PSG layer having a thickness of from about 2000 to 4000 Å; and
an upper nitride or silicon nitride layer having a thickness of from about 3000 to 8000 Å.

23. The method of claim 1, wherein the passivation layer is comprised of:
a lower PSG layer having a thickness of from about 2500 to 3500 Å; and
an upper nitride or silicon nitride layer having a thickness of from about 4000 to 6000 Å.

24. The method of claim 1, wherein the trench is etched using an etch selected from the group consisting of a reactive ion etch, an high density plasma oxide etch and an inductive couple plasma etch.

25. The method of claim 1, wherein the trench is etched using a reactive ion etch.

26. The method of claim 1, wherein the channel is etched using an isotropic etch.

27. The method of claim 1, wherein the selective etching of the silicon-damaged silicon oxide region to form the channel also removes a portion of the silicon substrate adjacent the silicon-damaged silicon oxide region.

28. The method of claim 1, wherein the selective etching of the silicon-damaged silicon oxide region to form the channel also removes from about 10 to 50 μm of the silicon substrate adjacent the silicon-damaged silicon oxide region.

29. The method of claim 1, wherein the channel has a maximum width of from about 50 to 500 μm.

30. A method of reducing semiconductor device substrate effects, comprising the steps of:
providing a silicon substrate;
selectively implanting $O^+$ or $O_2^+$ into the silicon substrate to form a silicon-damaged silicon oxide region having a width of from about 8 to 52 μm;
forming one or more semiconductor devices over the silicon substrate proximate the silicon-damaged silicon oxide region within at least one upper dielectric layer;
forming a passivation layer over the at least one upper dielectric layer;
patterning the passivation layer and the at least one upper dielectric layer to form a trench exposing a portion of the silicon substrate over the silicon-damaged silicon oxide region; and
selectively etching the silicon-damaged silicon oxide region to form a channel continuous and contiguous with the trench whereby the channel reduces the substrate effects of the one or more semiconductor devices.

31. The method of claim 30, including the step of forming an uppermost sealing layer over the patterned passivation layer.

32. The method of claim 30, including the step of forming an uppermost sealing layer over the patterned passivation layer, the uppermost sealing layer is comprised of a material selected from the group consisting of PECVD nitride and PECVD silicon nitride.

33. The method of claim 30, including the step of forming an uppermost sealing layer over the patterned passivation layer, the uppermost sealing layer is comprised of PECVD silicon nitride.

34. The method of claim 30, wherein a first patterned masking layer is formed over the silicon substrate to define the location of the $O^+$ or $O_2^+$ implantation into the silicon substrate.

35. The method of claim 30, wherein a first patterned photoresist layer is formed over the silicon substrate to define the location of the $O^+$ or $O_2^+$ implantation into the silicon substrate.

36. The method of claim 30, wherein the $O^+$ or $O_2^+$ is implanted into the silicon substrate to a depth of from about 1000 to 20,000 Å.

37. The method of claim 30, wherein the $O^+$ or $O_2^+$ is implanted into the silicon substrate to a depth of from about 5000 to 10,000 Å.

38. The method of claim 30, wherein the $O^+$ or $O_2^+$ is implanted into the silicon substrate to a dose of from about 1E16 to 1E17 ions/cm$^2$.

39. The method of claim 30, wherein the $O^+$ or $O_2^+$ is implanted into the silicon substrate to a dose of from about 4E16 to 8E16 ions/cm$^2$.

40. The method of claim 30, wherein the silicon-damaged silicon oxide region has a width of from about 10 to 50 µm.

41. The method of claim 30, wherein the at least one upper dielectric layer is comprised of a material selected from the group consisting of boron phosphorus silicon glass (BPSG), PECVD TEOS oxide, APCVD O$_3$/TEOS oxide and HDP oxide.

42. The method of claim 30, wherein the at least one upper dielectric layer is comprised of BPSG doped oxide.

43. The method of claim 30, wherein the at least one upper dielectric layer comprises:
a lower dielectric layer comprised of a material selected from the group consisting of boron phosphorus silicon glass (BPSG), PECVD TEOS oxide, APCVD O$_3$/TEOS oxide and HDP oxide; and
an upper dielectric layer comprised of a material selected from the group consisting of an HDP oxide/TEOS oxide sandwich, PECVD SiH$_4$ oxide, PECVD TEOS oxide and HDP oxide.

44. The method of claim 30, wherein the at least one upper dielectric layer comprises:
a lower dielectric layer comprised of BPSG doped oxide; and
an upper dielectric layer comprised of an HDP oxide/TEOS oxide sandwich.

45. The method of claim 30, wherein the one or more semiconductor devices is one or more MOS devices.

46. The method of claim 30, wherein the one or more semiconductor devices is one or more inductors.

47. The method of claim 30, wherein the one or more semiconductor devices is one or more MOS devices and one or more inductors.

48. The method of claim 30, wherein the passivation layer is comprised of a lower layer and an upper layer.

49. The method of claim 30, wherein the passivation layer is comprised of a lower PSG layer and an upper nitride or silicon nitride layer.

50. The method of claim 30, wherein the passivation layer is comprised of:
a lower PSG layer having a thickness of from about 2000 to 4000 Å; and
an upper nitride or silicon nitride layer having a thickness of from about 3000 to 8000 Å.

51. The method of claim 30, wherein the passivation layer is comprised of:
a lower PSG layer having a thickness of from about 2500 to 3500 Å; and
an upper nitride or silicon nitride layer having a thickness of from about 4000 to 6000 Å.

52. The method of claim 30, wherein the trench is etched using an etch selected from the group consisting of a reactive ion etch, an high density plasma oxide etch and an inductive couple plasma etch.

53. The method of claim 30, wherein the trench is etched using a reactive ion etch.

54. The method of claim 30, wherein the channel is etched using an isotropic etch.

55. The method of claim 30, wherein the selective etching of the silicon-damaged silicon oxide region to form the channel also removes a portion of the silicon substrate adjacent the silicon-damaged silicon oxide region.

56. The method of claim 30, wherein the selective etching of the silicon-damaged silicon oxide region to form the channel also removes from about 10 to 50 µm of the silicon substrate adjacent the silicon-damaged silicon oxide region.

57. The method of claim 30, wherein the channel has a maximum width of from about 50 to 500 µm.

58. A method of reducing substrate effects under an analog device, comprising the steps of:
providing a substrate;
forming a silicon oxide layer over the substrate;
forming a silicon layer upon the silicon oxide layer;
forming one or more dielectric layers over the silicon oxide layer; the one or more dielectric layers including an analog device;
forming a passivation layer over the one or more dielectric layers;
patterning the passivation layer, the one or more dielectric layers and the silicon layer to form a trench exposing a first portion of the silicon oxide layer proximate the analog device; the trench having expose side walls;
forming sidewall spacers over the exposed side walls of the trench; the sidewall spacers forming an opening exposing a second portion of the silicon oxide layer that is less than the first exposed portion of the silicon oxide layer; and
etching the silicon oxide layer through the second exposed portion of the silicon oxide layer to form a channel extending at least part way beneath the analog device, whereby the channel reduces the substrate effects of the analog device.

59. The method of claim 58, wherein the substrate is a silicon substrate.

60. The method of claim 58, wherein the silicon oxide layer has a thickness of from about 500 to 2000 Å and the silicon layer has a thickness of from about 500 to 2000 Å.

61. The method of claim 58, wherein the silicon oxide layer has a thickness of from about 500 to 1500 Å and the silicon layer has a thickness of from about 500 to 1500 Å.

62. The method of claim 58, wherein the passivation layer is comprised of a lower layer and an upper layer.

63. The method of claim 58, wherein the passivation layer is comprised of a lower PSG layer and an upper nitride or silicon nitride layer.

64. The method of claim 58, wherein the passivation layer is comprised of:
a lower PSG layer having a thickness of from about 2000 to 4000 Å; and
an upper nitride or silicon nitride layer having a thickness of from about 3000 to 8000 Å.

65. The method of claim 58, wherein the passivation layer is comprised of:

a lower PSG layer having a thickness of from about 2500 to 3500 Å; and an upper nitride or silicon nitride layer having a thickness of from about 4000 to 6000 Å.

66. The method of claim 58, including the step of forming a MOS device on the substrate proximate the analog device, whereby the channel extends at least partially under the MOS device.

67. The method of claim 58, wherein the one or more dielectric layers are ILD layers.

68. The method of claim 58, wherein the one or more dielectric layers are comprised of a material selected from the group consisting of PECVD TEOS oxide, PECVD $SiH_4$ oxide, HDP oxide and a low-k dielectric material.

69. The method of claim 58, wherein the one or more dielectric layers are comprised of a low-k dielectric material.

70. The method of claim 58, wherein the sidewall spacers are comprised of a material selected from the group consisting of nitride and silicon nitride.

71. The method of claim 58, wherein the channel is formed using a wet etch process.

72. The method of claim 58, wherein the channel is formed using a wet etch employing a 10:1 dilute HF solution.

73. The method of claim 58, wherein the channel has a width of from about 50 to 250 μm.

74. The method of claim 58, wherein the channel has a width of from about 100 to 200 μm.

75. A method of reducing substrate effects under an analog device, comprising the steps of:

providing a silicon substrate;

forming a silicon oxide layer over the silicon substrate;

forming a silicon layer upon the silicon oxide layer;

forming one or more dielectric layers over the silicon oxide layer; the one or more dielectric layers including an analog device;

forming a passivation layer over the one or more dielectric layers;

patterning the passivation layer, the one or more dielectric layers and the silicon layer to form a trench exposing a first portion of the silicon oxide layer proximate the analog device; the trench having exposed side walls;

forming sidewall spacers over the exposed side walls of the trench; the sidewall spacers forming an opening exposing a second portion of the silicon oxide layer that is less than the first exposed portion of the silicon oxide layer; and etching the silicon oxide layer through the second exposed portion of the silicon oxide layer to form a channel extending at least part way beneath the analog device, whereby the channel reduces the substrate effects of the analog device.

76. The method of claim 75, wherein the silicon oxide layer has a thickness of from about 500 to 2000 Å and the silicon layer has a thickness of from about 500 to 2000 Å.

77. The method of claim 75, wherein the silicon oxide layer has a thickness of from about 500 to 1500 Å and the silicon layer has a thickness of from about 500 to 1500 Å.

78. The method of claim 75, including the step of forming a MOS device on the substrate proximate the analog device, whereby the channel extends at least partially under the MOS device.

79. The method of claim 75, wherein the passivation layer is comprised of a lower layer and an upper layer.

80. The method of claim 75, wherein the passivation layer is comprised of a lower PSG layer and an upper nitride or silicon nitride layer.

81. The method of claim 75, wherein the passivation layer is comprised of:

a lower PSG layer having a thickness of from about 2000 to 4000 Å; and an upper nitride or silicon nitride layer having a thickness of from about 3000 to 8000 Å.

82. The method of claim 75, wherein the passivation layer is comprised of:

a lower PSG layer having a thickness of from about 2500 to 3500 Å; and an upper nitride or silicon nitride layer having a thickness of from about 4000 to 6000 Å.

83. The method of claim 75, wherein the one or more dielectric layers are ILD layers.

84. The method of claim 75, wherein the one or more dielectric layers are comprised of a material selected from the group consisting of PECVD TEOS oxide, PECVD $SiH_4$ oxide, HDP oxide and a low-k dielectric material.

85. The method of claim 75, wherein the one or more dielectric layers are comprised of a low-k material.

86. The method of claim 75, wherein sidewall spacers are comprised of a material selected from the group consisting of nitride and silicon nitride.

87. The method of claim 75, wherein the channel is formed using a wet etch process.

88. The method of claim 75, wherein the channel is formed using a wet etch employing a 10:1 dilute HF solution.

89. The method of claim 75, wherein the channel has a width of from about 50 to 150 μm.

90. The method of claim 75, wherein the channel has a width of from about 100 to 200 μm.

* * * * *